United States Patent [19]

Sako et al.

[11] Patent Number: 4,785,451
[45] Date of Patent: Nov. 15, 1988

[54] GENERATOR FOR AN ERROR CORRECTING CODE, A DECODER THEREFORE, AND A METHOD FOR THE SAME

[75] Inventors: Yoichiro Sako; Shinichi Yamamura, both of Tokyo, Japan

[73] Assignee: Sony Corporation, Tokyo, Japan

[21] Appl. No.: 539

[22] Filed: Jan. 5, 1987

[30] Foreign Application Priority Data

Jan. 10, 1986 [JP] Japan .................... 61-3147
Jan. 24, 1986 [JP] Japan .................... 61-13553

[51] Int. Cl.[4] ............................................. G06F 11/10
[52] U.S. Cl. ........................................ 371/37; 371/39
[58] Field of Search ............... 371/37, 38, 39, 40, 371/50, 5

[56] References Cited

U.S. PATENT DOCUMENTS

| | | | |
|---|---|---|---|
| 4,306,305 | 12/1981 | Doi | 371/40 |
| 4,336,612 | 6/1982 | Inoue | 371/38 |
| 4,541,091 | 9/1985 | Nishida | 371/5 |
| 4,562,578 | 12/1985 | Odaka | 371/40 |
| 4,607,367 | 8/1986 | Ive | 371/37 |
| 4,630,272 | 12/1986 | Fukami et al. | 371/37 |
| 4,653,051 | 3/1987 | Sugimura | 371/37 |
| 4,653,052 | 3/1987 | Doi et al. | 371/39 |
| 4,660,202 | 4/1987 | Woodsum | 371/37 |
| 4,680,764 | 7/1987 | Suzuki et al. | 371/40 |
| 4,688,255 | 8/1987 | Fukami | 371/37 |
| 4,696,007 | 9/1987 | Moriyema | 371/37 |
| 4,698,810 | 10/1987 | Fukuda et al. | 371/38 |

*Primary Examiner*—Michael R. Fleming
*Attorney, Agent, or Firm*—Philip M. Shaw, Jr.

[57] ABSTRACT

A rectangular array is formed by a predetermined amount of data and an error detecting code that detects a possible error contained in the data. Each error correcting code is formed from data in each of the row and column directions of the rectangular array and is added to the rectangular array to thereby provide a product code. When the product code is arranged, row data in each of the row directions of the rectangular array is supplied to an error correcting code generator which generates the error correcting codes in sequence. At the same time, the respective data is supplied sequentially to the error detecting code generator and thereby a unique error detecting code is generated. When the decoding is carried out by using the error correcting code, the error correcting process is ended in response to the acceptance of a data request signal and then, the presence or absence of a data error in the error corrected data is checked by using the error detecting code. When the data error is not detected, that data is delivered.

14 Claims, 3 Drawing Sheets

GENERATOR FOR AN ERROR CORRECTING CODE, A DECODER THEREFORE, AND A METHOD FOR THE SAME

BACKGROUND OF THE INVENTION

1. Field of the Invention

This invention relates to error correction of digital signals and is directed more particularly to a generator for an error correcting code and a decoder for the code.

2. Description of the Prior Art

In order to detect and correct a data error which has occurred in data when the data is transmitted through a transmission path or recorded on a recording medium, it is known to add an error correcting code and an error detecting code to the data that is to be transmitted or recorded. According to this known technology, an error correcting code, such as b-adjacent code, Reed Solomon code, or the like, to be used to correct data errors occurring in a predetermined amount of transmitted or recorded data, is generated and then added to the predetermined amount of data to be transmitted or recorded. An error detecting code is then generated from the error correcting code and the predetermined amount of data to be transmitted or recorded. The data is added to the thus generated error correcting code and the error detecting code and the sum is delivered to the transmission path or the recording medium.

The data with the error correcting code and the error detecting code which is received via the transmission path or reproduced from the recording media undergoes the following data processing to correct a possible error which may appear therein. Specifically, the possible errors in both the data received and the error correcting codes added to this data are checked by using the error detecting code. When a data error is detected through the above-mentioned checking, the error is corrected by using the aforementioned error correcting code. In other words, the error detecting code in this case is used to check for the existence of an error in the received data before the data is subsequently error-corrected.

Further, there is known a so-called product code that is used to correct possible errors in the data. In making this product code, a predetermined amount of data is arranged as a rectangular array and error correcting codes are generated for the data in the row and column directions of the rectangular array. The known Reed Solomon code can be employed as this error correcting code, by way of example. The above-mentioned data and error correcting codes are transmitted sequentially to the transmission path or recording medium in a predetermined order. The data with the error correcting code received via the transmission path or from the recording medium is arranged again as a rectangular array and each error correcting code generated for the data in the row and column directions of the rectangular array is used to correct possible data errors.

Prior art systems of this type have at least two drawbacks which will be discussed in greater detail further in this specification. First, it is possible that further errors may be introduced during error correction or that not all of the errors are corrected. In the above described prior art systems, error detecting is done before the error correction. A second problem of some prior art systems is that the processing time to generate the error detecting code is too long.

OBJECTS AND SUMMARY OF THE INVENTION

Accordingly, it is an object of this invention to provide an improved generator for generating an error correcting code and a decoder using the code.

It is another object of this invention to provide a generator for generating an error detecting code which can considerably reduce the processing time to generate the error detecting code.

It is a further object of this invention to provide a generator for generating an error correcting code and a decoder using the code which is suitable for error correcting digital signals.

According to one aspect of the present invention, there are provided a generator for generating an error correcting code and a decoder which uses the code. In this case, an error detecting code for detecting a possible error in a predetermined amount of data to be transmitted or recorded is generated and then added to such data. In order that the sum of this data and the error detecting code may just form a rectangular array, the amount of this data and the error detecting code are first determined. This data with the error detecting code is then arranged in a rectangular array and the error correcting codes are generated for the data in the row and column directions of this rectangular array to thereby construct a so-called product code.

When this product code is constructed, the data of each row in the row direction of the rectangular array is supplied sequentially to an error correcting code generator so as to generate an error correcting code for every row. At the same time, the data of each row is supplied sequentially to an error detecting code generator. When the last digit of the predetermined amount of data to be transmitted or recorded is supplied to the error detecting code generator, there is generated a unique error correcting code. The data in the last row of the rectangular array and the error detecting code which is located in the last row of the rectangular array are then supplied to the error correcting code generator to thereby generate a last error correcting code in the row direction. When the decoding is carried out by using the product code, the error correction process is ended in response to the acceptance of a data request signal from the outside. The error corrected data is then checked for data error by using the error detecting code. When no data error is detected, the thus error corrected data is outputted.

The invention thus accomplishes error detection after error correction. Furthermore, the processing time to generate the error detecting code is greatly reduced because it is generated simultaneously with the error correcting code.

These and other objects, features and advantages of the present invention will be apparent from the following detailed description of the preferred embodiments that is to be read in conjunction with the attached drawings, in which like reference numerals identify like elements and parts in the several views.

DESCRIPTION OF THE PREFERRED EMBODIMENTS

Now, the present invention will be described hereinafter with reference to the attached drawings.

Figure 1:
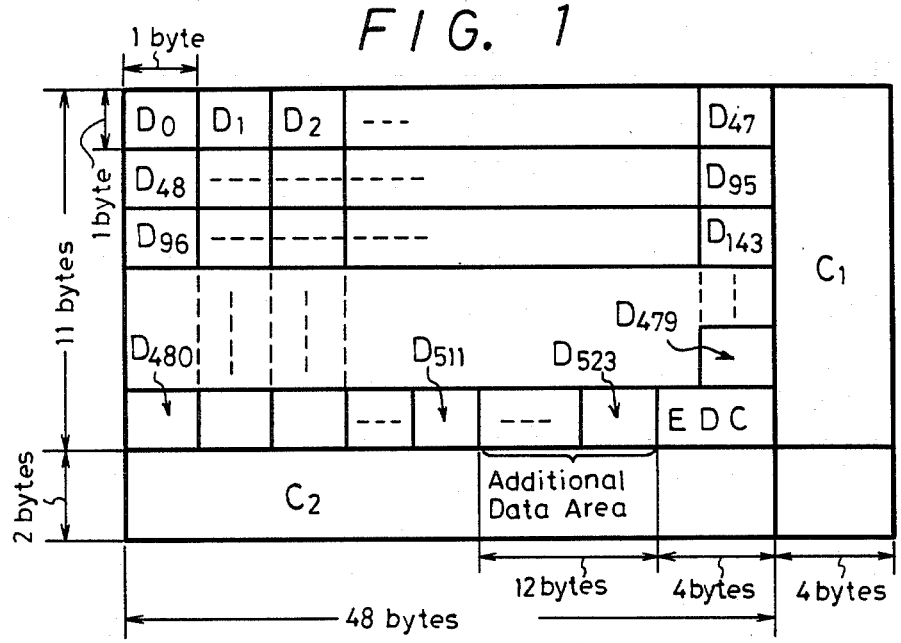
FIG. 1 is a diagrammatical representation of the arrangement of a product code according to the present invention.

FIG. 1 shows an arrangement of a product code used in this invention. The amount of product code data is chosen in consideration that it will be recorded on a floppy disc or magneto-optical disc used as a computer mass storage. Specifically, a disc-shaped recording medium used for computer mass storage is segmented into a plurality of sectors; for example, the standard amount of data recorded in each sector is selected as 512 bytes. Accordingly, in this invention, 512-bytes of data is taken as the fundamental unit and the product code is formed in part by the data that is an integer multiple of the fundamental data unit (512 bytes). In FIG. 1, 512 bytes are selected as the amount of data that is used to make up the product code, by way of example.

The product code shown in FIG. 1 consists of a data portion and a parity portion. The data portion is formed of 512-bytes of data $D_0$-$D_{511}$ to be transmitted or recorded, 12-bytes of additional data $D_{511}$-$D_{523}$ that is indicative of a track number and a sector number showing the recorded position of the 512-bytes of data on the disc-shaped recording medium or other data identifying information and the like, and a 4-byte error detecting code EDC generated to detect the possible error of the 524-bytes of data (i.e., the 512-bytes of data plus the 12-bytes of additional data). The total of 528-bytes of data is arranged as a rectangular array in which the columns are formed of 11 bytes each and the rows are formed of 48 bytes each.

With respect to the row direction of this rectangular array, there is formed a first error correcting code $C_1$ (for example, (52, 48) Reed-Solomon code), while, with respect to the column direction, there is formed a second error correcting code $C_2$ (for example, (13, 11) Reed-Solomon code), thus forming the parity portion of this product code. In this invention, after the error correction of data is carried out by using the first and second error correction codes $C_1$ and $C_2$ that in part make up the product code, possible errors in the error-corrected data are finally checked by using an error detecting code EDC. Consequently, even when an erroneous error correction is carried out, the existing error can be detected positively by this error detecting code so that only the correct data can always be decoded and then outputted.

Figure 2:
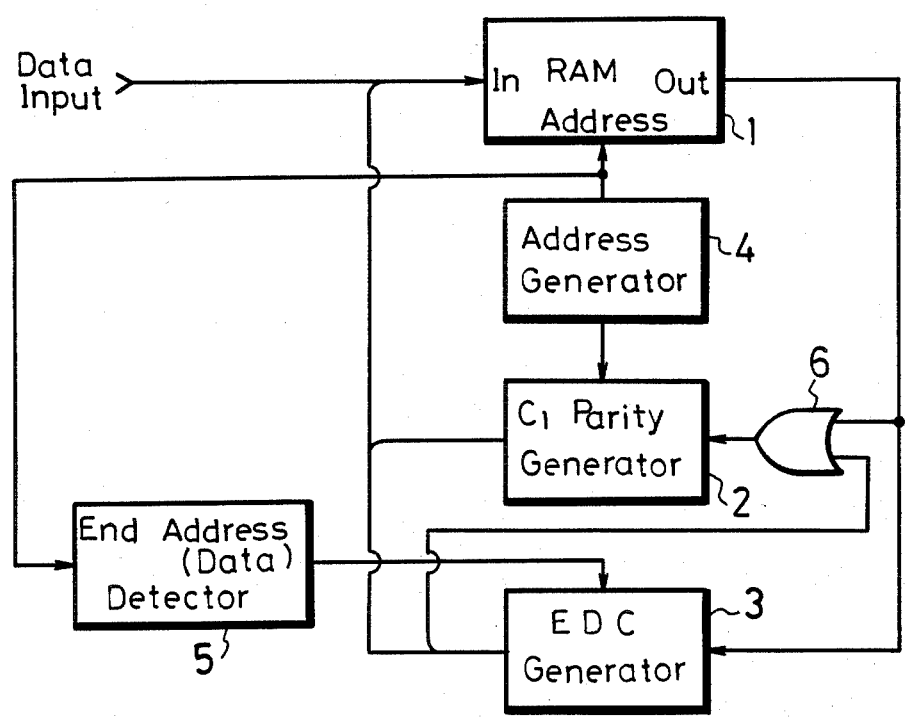
FIG. 2 is a block diagram of an error correcting code generator for co-producing an error detecting code according to the present invention.

FIG. 2 is a block diagram showing an embodiment of an error correcting code generator according to the present invention in which when the aforementioned product code is made up, a generator circuit for generating the $C_1$ parity and a generator circuit for generating the error detecting code EDC are operated simultaneously to thereby reduce the time required to generate the respective codes.

Referring to FIG. 2, a RAM (random access memory) data buffer 1 stores the predetermined amount of data (e.g. $D_0$-$D_{523}$), the respective parities $C_1$ and $C_2$ generated on the basis of this data and the error detecting code EDC. Further, a $C_1$ parity generator circuit 2 generates the error correcting code $C_1$ and an error detecting code generator 3 generates the error detecting code EDC. An address generator circuit 4 generates an address signal which is supplied to the RAM 1. An end address detector circuit 5 receives the address signal from the address generator circuit 4 and instructs the error detecting code generator 3 to deliver the unit of data (e.g., 512-bytes of data) necessary to generate the error detecting code from the RAM 1 to the error detecting code generator 3.

With the thus constructed circuit arrangement, the $C_1$ parity and the error detecting code EDC are generated as follows: On the basis of the address signal generated from the address generator circuit 4, the data making up each row of the rectangular array is read out sequentially from the RAM 1 and fed through an OR gate 6 to the $C_1$ parity generator circuit 2. The data forming each row of the rectangular array is also sequentially supplied directly to the error detecting code generator 3. In this embodiment, a CRC (cyclic redundancy check) code is employed as the error detecting code EDC. Alternatively, the error correcting code may be employed as the error detecting code.

The $C_1$ parity generator circuit 2 is supplied sequentially with the data forming each row and generates the $C_1$ parity for the data that makes up the row. This $C_1$ parity generator circuit 2 is supplied with the address signal from the address generator circuit 4. Hence, on the basis of the address signal supplied thereto, the $C_1$ parity generator circuit 2 identifies each section between the data forming the respective rows. In this way, a $C_1$ parity is generated at the end of the data making up each row. The codes generated respectively by the $C_1$ parity generator circuit 2 and the error detecting code generator circuit 3 are stored in the RAM 1.

When the data of the last row $D_{480}$-$D_{523}$ of the rectangular array of the data is supplied to the error detecting code generator circuit 3, an output signal from the end address detector 5 for detecting the last data $D_{523}$ byte causes the error detecting code generator 3 to output the error detecting code EDC and store it in the RAM 1 and also supply it through the OR gate 6 to the $C_1$ parity generator circuit 2. When the $C_1$ parity generator circuit 2 is supplied with the data used to generate the error detecting code EDC in the last row, the $C_1$ parity generator circuit 2 generates the last $C_1$ parity for the data of the last row on the basis of this error detecting code EDC which is then supplied to the RAM 1.

In summary, as described above, in the error correcting code generator circuit of the invention, when the transmitted or recorded data and the error detecting code used to detect the possible error in this data are formed as the product code, the data of each row of the rectangular array is supplied to the $C_1$ parity generator circuit 2 as one unit of data. The $C_1$ parity generator circuit 2 then generates the error correcting code to produce the $C_1$ parity for the data of each row. The data of each row is simultaneously supplied sequentially to the error detecting code generator circuit 3. When the error detecting code generator circuit 3 is supplied with the data located at the last row used to generate the error detecting code EDC, the generator circuit 3 generates the error detecting code EDC. This error detecting code EDC is stored in the RAM 1 and thereby added to the transmitted or recorded data. Also, this error detecting code EDC is supplied to the $C_1$ parity generator circuit 2 which then generates the last $C_1$ parity for all of the last row data (including the EDC). Further, though not shown, the $C_2$ parity for the data on each column is generated by a method similar to that shown in FIG. 2.

As described above, since the $C_1$ parity generator circuit 2 and the error detecting code generator circuit 3 function simultaneously, the processing time for generating the error detecting code EDC can be reduced as compared with the prior art systems where the $C_1$ parity generator circuit and the EDC generator circuit are operated sequentially.

Figure 3:
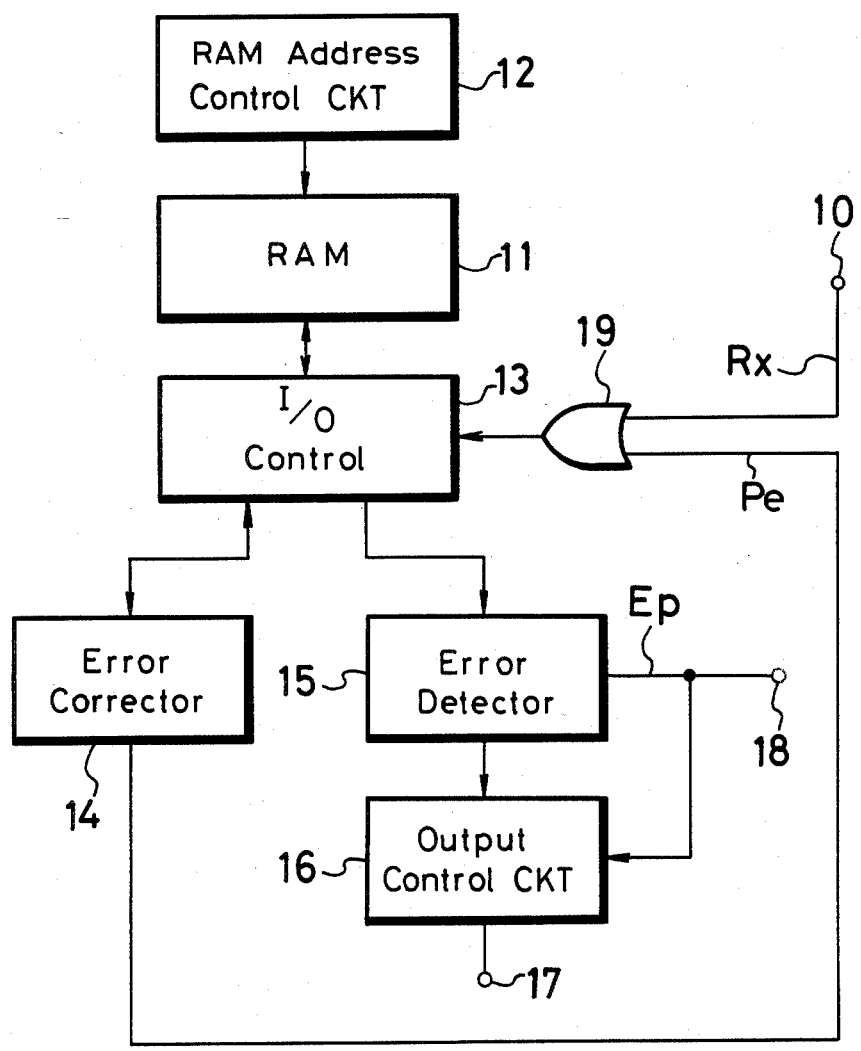
FIG. 3 is a block diagram showing a decoder of the present invention.

FIG. 3 is a block diagram showing a decoder that is used to decode the above-mentioned product code so as to generate decoded data.

In some prior art decoders, when a data request signal arrives during the error correction processing, the data cannot be transmitted until the error correction processing is ended. This causes the accessing time of the data storage apparatus to become too long. The decoder of the present invention decodes a product code which is formed of a predetermined amount of data (e.g. 512-bytes), a data error detection code EDC, such as a cyclic redundancy check code, and an error correction code $C_1$ which is generated and added thereto.

FIG. 3 is a schematic block diagram showing an embodiment of the above decoder according to the present invention. As illustrated in FIG. 3, the decoder of this invention is provided with an error correcting circuit 14 for error-correcting the data by using the error correcting code until a data request signal Rx for commanding the transmission of data from the decoder is applied to the decoder from the outside. An error detecting circuit 15 using, for example, a CRC (cyclic redundancy check) code carries out the error detection by using the error detecting code EDC after the above mentioned data request signal Rx is supplied to the decoder or after the error correction is ended by the error correcting circuit 14.

In this decoder, the data reproduced from a disc-shaped medium such as a magneto-optical disc or the like is error-corrected by the error correcting code that makes up the product code, the thus error-corrected data is error-detected by the error detecting code EDC and then the thus error-corrected data is transmitted to a drive controller, a host processor and so on, although not illustrated in the figure, in response to the data request signal Rx supplied from the outside. At a midpoint of the error correction processing, when the data request signal Rx is received by the decoder, the decoder is switched from the error correcting operation mode to the error detecting operation mode. In this case, the error correction processing up to the midpoint of the error correcting processing is treated as being effective. Then, a predetermined amount of data, which is thus error-corrected at that time, is checked for error by the error detecting code EDC and the thus error-checked data is supplied to the drive controller, the host processor (not shown) or the like in response to the data request signal Rx supplied to the decoder from the outside. Accordingly, it is possible for the decoder to deliver the data immediately after it receives the data request signal Rx.

Referring to FIG. 3, there is provided a RAM (random access memory) 11 which stores product-coded data. This product-coded data is formed of the transmitted or recorded data $D_0$--$D_{523}$, an error detecting code EDC used to detect possible errors in this data and the error correcting codes $C_1$, $C_2$ that are generated for each of the row and column directions of the rectangular array formed of the above mentioned data and the error detecting code EDC. The write address and the read address for the RAM 11 are generated from a RAM address control circuit 12. The product-coded data read out of the RAM 11 is supplied through an I/O (input/output) control circuit 13 to the error correcting circuit 14. The error correcting circuit 14 performs the error correction by using the product code and the error-corrected data is then supplied from the error correcting circuit 14 back through the I/O control circuit 13 to be stored again in the RAM 11.

An error detecting circuit 15 checks for any possible errors which may be contained in the error-corrected data by carrying out the CRC code calculation using a generating polynomial. Then, the error detecting circuit 15 generates an error pulse Ep which corresponds to the presence or absence of the possible error. For instance, the error pulse Ep becomes low in level when no possible error exists and becomes high in level when a possible error exists. This error pulse Ep is delivered to an ouput terminal 18 in order to request the data re-transmission, add is also supplied to an output control circuit 16 in order to control this circuit 16 for sending no error data outside.

The data error-checked by the error detecting circuit 15 is delivered through the output control circuit 16 to an output terminal 17. As earlier noted, the output control circuit 16 is controlled by the error pulse Ep. Accordingly, when no error is detected by the error detecting circuit 15 and the error pulse Ep is low in level, the data is delivered through the output control circuit 16 to the output terminal 17. On the other hand, when an error is detected by the error detecting circuit 15 the error pulse Ep is high in level, and the output control circuit 16 is turned off so that the data is inhibited from being transmitted and the data re-transmission request signal is formed in response to the error pulse Ep.

An error correction end signal Pe is generated from the error correcting circuit 14. This error correction end signal Pe is supplied to one input of an OR gate 19 whose other input is supplied with the data request signal Rx from the input terminal 10. The output from the OR gate 19 is supplied to the I/O control circuit 13.

The product-coded data is stored in the RAM 11 so that when the decoder of the invention starts its decoding operation, the I/O control circuit 13 is allowed to supply the product-coded data derived from the RAM 11 to the error correcting circuit 14. Thereafter, when the error correction end signal Pe is generated from the error correcting circuit 14 or the data request signal Rx is supplied through the OR gate 19 to the I/O control circuit 13, the I/O control circuit 13 is permitted to supply to the error detecting circuit 15 the error-corrected data that is stored in the RAM 11. The error detecting circuit 15 carries out the aforementioned error detecting operation and generates the error pulse Ep.

The decoder of the invention can switch its operation mode from the error correction mode to the error detection mode after the error correction end signal Pe is generated. Alternatively, the decoder of the invention may switch its operation mode from the error correction mode to the error detection mode when the data request signal Rx is supplied thereto. When the data request signal Rx arrives, even if the error correcting operation is not yet finished, the decoder of the invention switches its mode to the error detection mode. In both cases, when the error detection is carried out and no errors in the data are detected, such error free data is output at the terminal 17 and then delivered to the host processor, the drive controller or the like (not shown).

Figure 4:
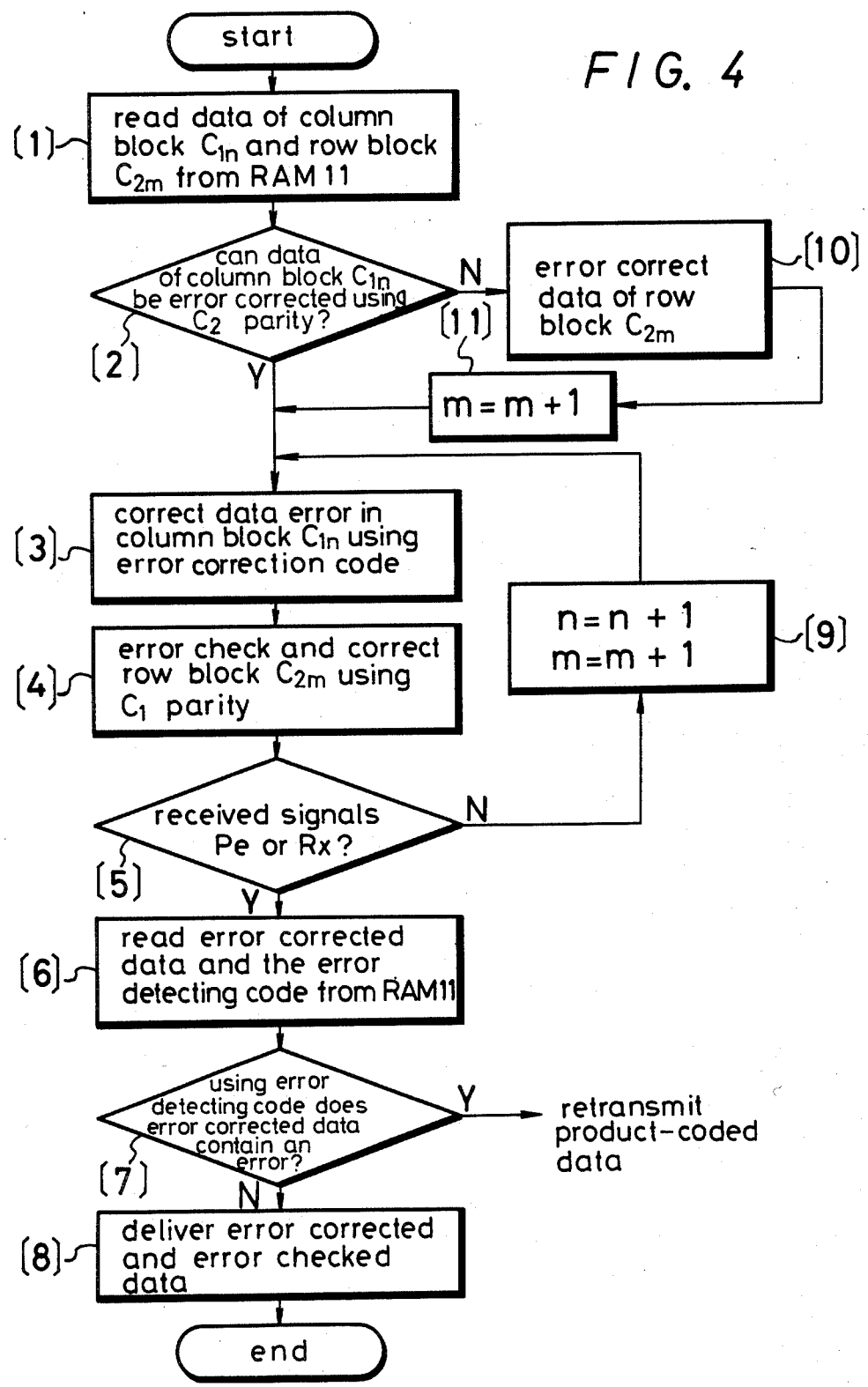
FIG. 4 is a flow chart to which reference will be made in explaining the decoding operation of the decoder in the present invention.

FIG. 4 is a flow chart to which reference will be made in explaining one example of the decoding processing of the decoder shown in FIG. 3. In the flow chart of FIG. 4, Y represents "Yes" and N represents "No". Further, $C_{1n}$ assumes an n-th column block of the product code and $C_{2m}$ assumes an m-th row block of the product code, respectively. The predetermined column block $C_{1n}$ or the predetermined row block $C_{2m}$ assumes a block series from which the decoding is started. For example, if $C_{1n}$ is taken as the start block of the error correction processing, the data of the column block $C_{1n}$ and the row block $C_{2m}$ used for the error correction are read out from the RAM 11 at step [1]. Then, in response to the syndrome using the $C_2$ parity, it is checked whether or not the data of the column block $C_{1n}$ can be error-corrected at step [2]. When no symbol error exists or one symbol error exists, the program goes to error correction processing for the data of the column block $C_{1n}$ at step [3]. The error correction is carried out by using, for example, the Reed Solomon oode. If no error exists, the error correction at step [3] is not carried out.

Next, the data of the row block $C_{2m}$ is error-checked by using $C_1$ parity. If the data contains any error, the data error is corrected at step [4]. It is checked at step [5] whether or not the error correction end signal Pe or the data request signal Rx is received by the decoder. If there exists the signal Pe or Rx, the error correction process is finished or stopped. Then, the program goes to step [6]. At step [6], the thus error-corrected data and the error detecting code EDC are read out of the RAM 11. Next, at step 7, it is checked by using this error detecting code EDC whether or not the thus error-corrected data contains a possible error. If it is determined at step [7] that a possible error exists in the error-corrected data, there is generated a signal which requests that the same product-coded data be transmitted again. If, on the other hand, no error is detected at step [7], the error-corrected data is delivered at step [8] and the program is ended.

If it is determined at step [5] that neither the error correction end signal Pe nor the data request signal Rx is received by the decoder, the block numbers (n and m) are each incremented by one (at step [9]) and the processing steps [3], [4] and [5] are repeatedly executed. Accordingly, the data of the $C_1$ block series and the $C_2$ block series are alternately error-corrected in the sequential order of ($C_{1n}$, $C_{2m}$, $C_{1n+1}$, $C_{2m+1}$, ...).

When it is determined at step [2] that the data of the column block $C_{1n}$, which is the decoding start series, cannot be error-corrected because it contains two or more error symbols, the data of the other row block $C_{2m}$ is error-corrected as the decoding start series (at step [10]). After the error correction of the data of the row block $C_{2m}$ is ended at step [10], the program goes to step [11] at which the block number m is incremented by one. Thereafter, the program goes back to the above mentioned step [3] at which the data of the column block $C_{1n}$ is error-corrected. Accordingly, the data of the C1 block series and the data of the C2 block series are alternately error-corrected in the sequential order of ($C_{2m}$, $C_{1n}$, $C_{2m+1}$, $C_{1n+1}$, ...).

It is possible to use other codes than the Reed Solomon code as the error correcting code. For example, when one symbol is formed of one bit, it is possible to employ the BCH code. Further, other codes than the CRC code can be used as the error detecting code EDC.

The above description is given for the preferred embodiments of the invention but it will be apparent that many modifications and variations could be effected by one skilled in the art without departing from the spirit or scope of the novel concepts of the invention so that the scope of the invention should be determined by the appended claims only.

We claim as our invention:

1. A generator for generating an error correcting code for correcting possible errors in a predetermined amount of digital data attached to an error detecting code for detecting the possible errors in said predetermined amount of data, comprising:
    (a) data block supply means for segmenting said predetermined amount of data into blocks of predetermined data length and for sequentially supplying said data blocks;
    (b) error correcting code generator means sequentially supplied with each of said data blocks from the data block supply means for generating separate error correcting codes corresponding to each of said data blocks;
    (c) last data block detection means for detecting the last data block supplied from said data block supply means and outputting a detection signal;
    (d) error detecting code generating means sequentially supplied with each of said data blocks from the data block supply means for generating a unique error detecting code, which is formed from the plurality of data blocks comprising said predetermined amount of data, in resonse to the detection signal from said last data detection means; and
    (e) means for suplying the error detecting code, which is derived from said error detecting code generating means, and said last data block to said error correcting code generating means, said error detecting code being added to said last data block to thereby form the predetermined data length which constructs one of said data blocks.

2. A generator for generating an error correcting code according to claim 1, in which said error correcting code is a Reed Solomon code.

3. A generator for generating an error correcting code according to claim 1, in which said error detecting code is a cyclic redundancy check code.

4. A generator for generating an error correcting code according to claim 1, in which said error detecting code is a Reed Solomon code.

5. A generator for generating an error correcting code according to claim 1, in which said predetermined amount of data is a 512-bytes of data.

6. A decoder for decoding a product code of the type which is formed from a predetermined amount of data, to which an error detecting code for such predetermined amount of data has been added and which is arranged in a rectangular array of rows and columns, and error correcting codes which are generated for the predetermined amount of data in the row and column directions, said decoder comprising:
    (a) correcting means for correcting said possible errors in said predetermined amount of data and said error detecting code by using said product code;
    (b) means for ending the error correction processing of said possible errors by said error correcting means in response to a data request signal supplied from an outside source;

(c) error detecting means, which when supplied with said data request signal, receives the predetermined amount of error corrected data from said error correcting means and checks for possible errors in said predetermined amount of error corrected data by using said error detecting code; and (d) means for outputting said predetermined amount of error checked data when no errors are detected by said error detecting means.

7. A decoder for decoding a product code according to claim 6, in which said error correcting code is a Reed Solomon code.

8. A decoder for decoding a product code according to claim 6, in which said error detecting code is a cyclic redundancy check code.

9. A decoder for decoding a product code according to claim 6, in which said error detecting code is a Reed Solomon code.

10. A decoder for decoding a product code according to claim 6, in which said predetermined amount of data is 512-bytes of data.

11. A decoder for decoding a product code according to claim 6, in which said error detecting means generates a product coded data re-transmission request signal when an error is detected by said error detecting code.

12. A method for generating an error correcting code for correcting possible errors in a predetermined amount of digital data attached to an error detecting code for detecting the possible errors in said predetermined amount of data, comprising the steps of:

(a) segmenting said predetermined amount of data into respective blocks of a predetermined data length;

(b) sequentially supplying said data blocks;

(c) sequentially generating an error correcting code corresponding to each of said supplied data blocks;

(d) receiving said data blocks sequentialy and generating an error detecting code in response to the supply of a last data block; and (e) generating an error correcting code corresponding to said last data block and said error detecting code, including the step of adding the data lengths of said last data block and said error detecting code to thereby form a data length of one block.

13. A method for decoding a product code of the type which is formed from a predetemined amount of data, to which an error detecting code for such predetermined amount of data has been added and which is arranged in a rectangular array of rows and columns, and error correcting codes which are generated for the predetermined amount of data in the row and column directions, comprising the steps of:

(a) correcting said possible errors in said predetermined amount of data and said error detecting code by using said product code;

(b) ending the error correction process in response to a data request signal supplied from an outside source;

(c) error-checking, when said data request signal arrives, by using said error detecting code attached to said error corrected predetermined amount of data;

(d) outputting said predetermined amount of error corrected data when no error is detected.

14. Apparatus for generating a product code comprising:

(a) means for receiving a predetermined amount of data and for segmenting said predetermined amount of data into blocks of predetermined data length and for sequentially supplying said data blocks;

(b) means sequentially supplied with said data blocks from the receiving means for generating an error detecting code for detecting possible errors in said predetermined amount of data, said error detecting code being generated from said predetermined amount of data, and for adding the error detecting code to the predetermined amount of data so as to form a rectangular array of data having rows which are one data block in length;

(c) means for generating a series of separate, first error correcting codes from corresponding blocks of data in each of the row directions of said rectangular array and adding each of said first error correcting codes to its corresponding block of data in each row direction; and (d) means for generating a series of separate, second error correcting codes from corresponding blocks of data in each of the column directions of said rectangular array and adding each of said second error correcting codes to its corresponding block of data in each column direction.

* * * * *